(12) United States Patent
Selim

(10) Patent No.: US 12,191,412 B2
(45) Date of Patent: Jan. 7, 2025

(54) DIGITAL DOPING AND DEVELOPMENT OF A TRANSPARENT CONDUCTOR

(71) Applicant: Bowling Green State University, Bowling Green, OH (US)

(72) Inventor: Farida Selim, Bowling Green, OH (US)

(73) Assignee: Bowling Green State University, Bowling Green, OH (US)

( * ) Notice: Subject to any disclaimer, the term of this patent is extended or adjusted under 35 U.S.C. 154(b) by 0 days.

(21) Appl. No.: 17/071,518

(22) Filed: Oct. 15, 2020

(65) Prior Publication Data

US 2021/0119068 A1 Apr. 22, 2021

Related U.S. Application Data

(60) Provisional application No. 62/915,968, filed on Oct. 16, 2019.

(51) Int. Cl.
*H01L 31/032* (2006.01)
*H01L 31/18* (2006.01)

(52) U.S. Cl.
CPC .......... *H01L 31/0321* (2013.01); *H01L 31/18* (2013.01); *H01L 31/1884* (2013.01)

(58) Field of Classification Search
None
See application file for complete search history.

(56) References Cited

U.S. PATENT DOCUMENTS

| | | | |
|---|---|---|---|
| 2007/0158765 A1* | 7/2007 | Ahn | C23C 16/45531 257/410 |
| 2011/0076513 A1* | 3/2011 | Tsai | C23C 16/407 428/697 |
| 2012/0058576 A1* | 3/2012 | Beck | C23C 16/45544 438/5 |
| 2012/0199935 A1* | 8/2012 | Chen | H01L 31/02161 257/461 |
| 2014/0203322 A1* | 7/2014 | Chang | H01L 33/42 257/99 |

OTHER PUBLICATIONS

Cho et al. IEEE Electron Device Letters, vol. 39, No. 5, May 2018, pp. 688-691. (Year: 2018).*
Johnson et al., Materials Today, vol. 17, No. 5, Jun. 2014, pp. 236-246. (Year: 2014).*
Higashiwaki et al., "Development of gallium oxide power devices", Physica Status Solidi A, 2014, vol. 211, No. 1, pp. 21-26.

* cited by examiner

*Primary Examiner* — Eli S Mekhlin
(74) *Attorney, Agent, or Firm* — MacMillan, Sobanski & Todd, LLC

(57) ABSTRACT

Compositions, thin films, devices, and methods involving doped oxide semiconductor materials are described. Indium gallium doped zinc oxide (IGZO) with advantageous properties that may be useful as a transparent conductive oxide (TCO) is described. Methods of digital doping to create doped oxide semiconductor materials are described.

17 Claims, 15 Drawing Sheets
(13 of 15 Drawing Sheet(s) Filed in Color)

DIGITAL DOPING AND DEVELOPMENT OF A TRANSPARENT CONDUCTOR

RELATED APPLICATIONS

This application claims priority to U.S. Provisional Application No. 62/915,968, filed under 35 U.S.C. § 111(b) on Oct. 16, 2019, the disclosure of which is incorporated herein by reference in its entirety for all purposes.

STATEMENT REGARDING FEDERALLY SPONSORED RESEARCH

This invention was made with no government support. The government has no rights in this invention.

BACKGROUND

Transparent conductor oxides (TCO) are one of the most important elements of optoelectronics such as light emitting diodes (LEDs) and photovoltaics. There is a need in the art for new and improved TCO materials, as well as new and improved methods for fabricating TCO materials.

SUMMARY

Provided is a thin film comprising an oxide semiconductor material, wherein the thin film comprises a plurality of oxide layers, and one atomic layer of a first dopant material deposited on the plurality of oxide layers. In certain embodiments, the thin film further comprises one atomic layer of a second dopant material deposited on the one atomic layer of first dopant material. In particular embodiments, the thin film further comprises an additional plurality of oxide layers deposited on the one atomic layer of second dopant material. In certain embodiments, the thin film comprises indium gallium doped zinc oxide (IGZO).

In certain embodiments, the first dopant material comprises $Ga_2O_3$. In certain embodiments, the second dopant material comprises $In_2O_3$. In certain embodiments, the oxide comprises ZnO.

In certain embodiments, the plurality of oxide layers comprises 49 layers of ZnO.

In certain embodiments, the thin film comprises a layer stack comprising one atomic layer of $In_2O_3$ deposited on one atomic layer of $Ga_2O_3$, wherein the atomic layer of $Ga_2O_3$ is deposited on a plurality of ZnO layers. In particular embodiments, the plurality of ZnO layers comprises 49 layers of ZnO. In particular embodiments, the thin film comprises a plurality of the layer stacks. In particular embodiments, the thin film comprises 30 of the layer stacks. In particular embodiments, the thin film comprises a total of 1530 atomic layers.

In certain embodiments, the thin film has a band gap of about 3.4 eV. In certain embodiments, the thin film has a mobility of greater than about 10 $cm^2/V\times s$. In certain embodiments, the thin film has a n-type carrier density on the order of about $10^{19}$ $cm^{-3}$.

In certain embodiments, the thin film is substantially transparent. In certain embodiments, each atomic layer has an average thickness of about 1.04 Å.

In certain embodiments, the thin film has a thickness of about 160 nm. In certain embodiments, the thin film has an average grain size ranging from about 10 nm to about 50 nm.

In certain embodiments, the thin film is a transparent conductive oxide layer in a photovoltaic device.

In certain embodiments, the thin film has a room temperature resistivity no greater than about $7.74\times10^{-4}$ Ω-cm. In certain embodiments, the thin film has an n-type carrier concentration on the order of about $10^{20}$ $cm^{-3}$.

Further provided is a layer structure comprising a thin film as described herein on a substrate. In certain embodiments, the substrate comprises glass, sapphire, fused silica, $Si/SiO_2$, strongium titanium oxide (STO), or barium-doped STO (BSTO).

Further provided is a composition comprising an oxide semiconductor having a single atomic layer of a dopant material deposited thereon. In certain embodiments, the oxide semiconductor comprises CdO, $In_2O_3$, indium tin oxide (ITO), $SnO_2$, or aluminum zinc oxide (AZO). In certain embodiments, the composition has a room temperature resistivity no greater than about $7.74\times10^{-4}$ Ω-cm.

Further provided is a composition comprising ZnO co-doped with about 1% In and about 1% Ga, wherein the composition has a band gap of about 3.4 eV, a mobility of greater than about 10 $cm^2/V\times s$, and a n-type carrier density on the order of about $10^{19}$ $cm^{-3}$. In certain embodiments, the composition has a room temperature resistivity no greater than about $7.74\times10^{-4}$ Ω-cm.

Further provided is an optoelectronic device comprising a thin film or composition as described herein. In certain embodiments, the optoelectronic device is a photovoltaic device or LED.

Further provided is a method for doping an oxide semiconductor, the method comprising depositing one or more atomic layers of an oxide semiconductor on a substrate; and depositing one atomic layer of a first dopant material on the one or more atomic layers of the oxide semiconductor to dope the oxide semiconductor. In certain embodiments, the method further comprises depositing one atomic layer of a second dopant material on the one atomic layer of the first dopant material. In particular embodiments, the method further comprises depositing one or more additional atomic layers of the oxide semiconductor on the one atomic layer of the second dopant material.

In certain embodiments, the oxide semiconductor comprises ZnO. In certain embodiments, the first dopant material comprises $Ga_2O_3$. In certain embodiments, the second dopant material comprises $In_2O_3$. In certain embodiments, the oxide semiconductor is doped with Ga and In. In certain embodiments, each of the layers is deposited by atomic layer deposition (ALD).

Further provided is a method for doping a thin film, the method comprising depositing an atomic layer of $Ga_2O_3$ on a plurality of atomic layers of ZnO; depositing an atomic layer of $In_2O_3$ on the atomic layer of $Ga_2O_3$; and depositing one or more additional atomic layers of ZnO on the atomic layer of $Ga_2O_3$.

In certain embodiments, the method comprises repeating each of the depositing steps a desired number of time. In certain embodiments, the plurality of atomic layers of ZnO comprises 49 atomic layers of ZnO. In certain embodiments, the method comprises repeating each of the depositing steps until a total of 1530 atomic layers is reached. In certain embodiments, each of the depositing steps is conducted by atomic layer deposition (ALD). In particular embodiments, the ALD comprises reacting precursors with a surface to deposit the layers, the precursors comprising diethyl zinc (DEZ), trimethyl gallium (TMG), and/or cyclopentadienyl indium (InCp). In certain embodiments, DEZ is used as a precursor to deposit the ZnO. In certain embodiments, TMG is used as a precursor to deposit the $Ga_2O_3$. In certain embodiments, InCp is used as a precursor to deposit the In$_2$O$_3$. In particular embodiments, each of the precursors is pulsed for about 0.06 seconds to react with the surface. In particular embodiments, the method comprises an oxidant pulse following each pulse of precursor. In particular embodiments, the oxidant comprises H$_2$O or plasma-assisted oxygen. In particular embodiments, the method comprises an N$_2$ purge between each precursor and oxidant pulse.

In certain embodiments, the ALD method is conducted in a vacuum chamber held at an elevated temperature. In particular embodiments, the elevated temperature ranges from about 150° C. to about 350° C. In particular embodiments, the elevated temperature is about 250° C. In particular embodiments, the vacuum chamber is held at a pressure of about 0.22 torr.

Further provided is a method for doping an oxide semiconductor material, the method comprising growing a single atomic layer between oxide layers to dope an oxide semiconductor material.

Further provided is the use of atomic layer deposition to dope an oxide semiconductor material with a single atomic layer of a dopant between oxide layers.

Further provided is an optoelectronic device comprising a doped oxide semiconductor material formed from depositing a single atomic layer on a plurality of oxide layers.

BRIEF DESCRIPTION OF THE DRAWINGS

The patent or application file may contain one or more drawings executed in color and/or one or more photographs. Copies of this patent or patent application publication with color drawing(s) and/or photograph(s) will be provided by the U.S. Patent and Trademark Office upon request and payment of the necessary fees.

FIG. 1C depicts the ALD layering process for digital doping of IGZO with diethyl zinc (DEZ) half reactions summarized in steps (1), (2), and (3). Metalorganic precursor pulses were followed by an oxidation step to form atomic oxide layers. The chemical reactions are self-limiting, due to the ALD process. A sequence of multiple pulses of DEZ followed by individual layers of TMG and InCp was repeated.

DETAILED DESCRIPTION

Figure 1A:
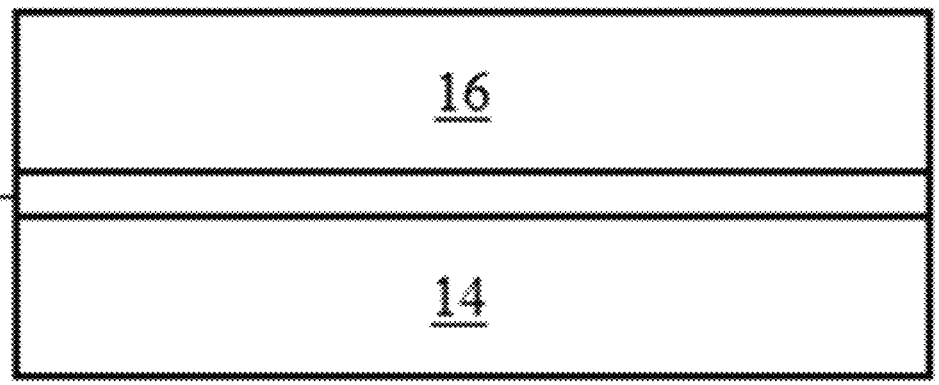
FIGS. 1A-1C: Schematics of a doped oxide semiconductor material (FIG. 1A), a co-doped oxide semiconductor material (FIG. 1B), and a non-limiting example IGZO (FIG. 1C) formed from the digital doping process described herein.

Throughout this disclosure, various publications, patents, and published patent specifications are referenced by an identifying citation. The disclosures of these publications, patents, and published patent specifications are hereby incorporated by reference into the present disclosure in their entirety to more fully describe the state of the art to which this invention pertains.

Various abbreviations may be used herein. The term "IGZO" refers to indium gallium doped zinc oxide. The term "TFT" refers to thin film transistor. The term "TCO" refers to transparent conductive oxide. The term "ITO" refers to indium tin oxide. The term "UV-Vis" refers to ultraviolet-visible. The term "PLD" refers to pulsed laser deposition. The term "ALD" refers to atomic layer deposition. The term "Si/SiO$_2$" refers to silicon buffered with a silicon oxide layer. The term "STO" refers to strontium titanium oxide. The term "BSTO" refers to barium-doped STO. The term "DEZ" refers to diethyl zinc. The term "TMG" refers to trimethyl gallium. The term "InCp" refers to cyclopentadienyl indium. The term "GZO" refers to gallium doped zinc oxide. The term "XRD" refers to x-ray diffraction. The term "SEM" refers to scanning electron microscopy. The term "AFM" refers to atomic force microscopy. The term "rms" refers to root mean square. The term "FOM" refers to figure of merit. The term "JCPDS" refers to Joint Committee on Powder Diffraction Standards.

In accordance with the present disclosure, oxide semiconductor materials may be doped by the growth of a single atomic layer of a dopant material between oxide layers. Surprisingly, it has been found that doping an oxide semiconductor material with single atomic layers can effectively dope the oxide semiconductor material. It is not currently known why this works to effectively dope an oxide semiconductor material.

Conventional doping methods during growth generally involve mixing a precursor with the required percentage of dopants. However, it has been found that good doping can be achieved with excellent solubility and uniformity by adding a layer of dopant atoms between the material layers. This method is very effective in producing highly conductive thin films. Given the precision with which this may be done, the term "digital doping" may be used to described this doping process. Digital doping allows for the development of TCO nano films with advantageous conductivity and light transparency, where the doping may be achieved with good solubility and high uniformity. As demonstrated in the examples herein, using digital doping, TCO nanofilms with comparable or higher conductivity and light transparency than industry standard indium tin oxide (ITO) have been developed.

ITO has been the standard for many transparent conductive oxide (TCO) applications. Provided herein is a TCO material that is comparable to, or better than, ITO. The example TCO material described herein is based on co-doping of ZnO with In and Ga as 1% In and 1% Ga, and may be referred to herein as IGZO. This developed TCO material is shown in the examples herein to give highly conductive, very thin films. The films are remarkable in their high conductivity, on the order of E-4 Ohm·cm, and in their high transparency. Highly conductive films of ZnO doped with In (1%) and Ga (1%) have also been obtained on a wide range of substrates, as-received or home-made, confirming effectiveness of the method for forming a TCO on any platform.

Single atomic layers of dopant materials may be deposited, for instance, through atomic layer deposition (ALD). ALD is a type of chemical vapor deposition in which gaseous precursors react with the surface of a material one at a time in a sequential, self-limiting manner. Through repeated exposure to separate precursors, a thin film may be slowly deposited. In other words, a film is grown on a substrate by exposing its surface to alternating gaseous precursors. Unlike most chemical vapor deposition techniques, the precursors are not present simultaneously, but are instead inserted to the reaction vessel as a series of sequential, non-overlapping pulses. By varying the number of cycles, it is possible to grow uniform layers with high precision. Furthermore, the number of cycles can be adjusted to produce a single atomic layer. Thus, through ALD, a time-controlled introduction of metal-ion precursors and oxygen with in-sequence purging may be used to deposit thin film oxides one atomic layer at a time. The method may provide highly controlled doping and produce a material with higher conductivity and light transparency than the industry standard ITO. Also, though ALD is described for exemplary purposes, the method may be employed with any alternative method that is capable of depositing single atomic layers.

Referring now to FIG. 1A, provided herein is a doped oxide semiconductor material formed from digital doping. The doped oxide semiconductor material is a layer stack 10 that includes a single atomic layer 12 of dopant material sandwiched between pluralities of oxide layers 14, 16. One atomic layer 12 of the dopant material is deposited on a first plurality of oxide layers 14, and a second plurality of oxide layers 16 is deposited on the one atomic layer 12 of the dopant material. For clarity, each 'layer' in the pluralities of layers is composed of more than one atomic layer.

Figure 1B:
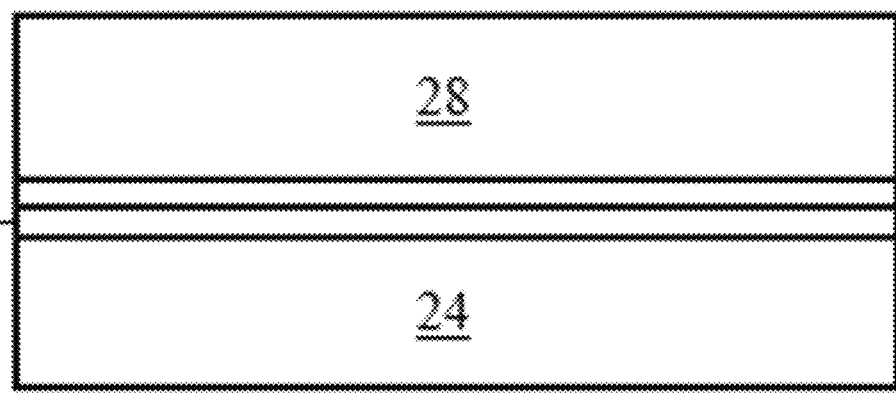

Referring now to FIG. 1B, provided herein is a co-doped oxide semiconductor material formed from digital doping. The co-doped oxide semiconductor material is a layer stack 20 that includes a single atomic layer 22 of a first dopant material deposited on a first plurality of oxide layers 24, a single atomic layer 26 of a second dopant material deposited on the single atomic layer 22 of the first dopant material, and a second plurality of oxide layers 28 deposited on the single atomic layer 26 of the second dopant material.

Figure 1C:
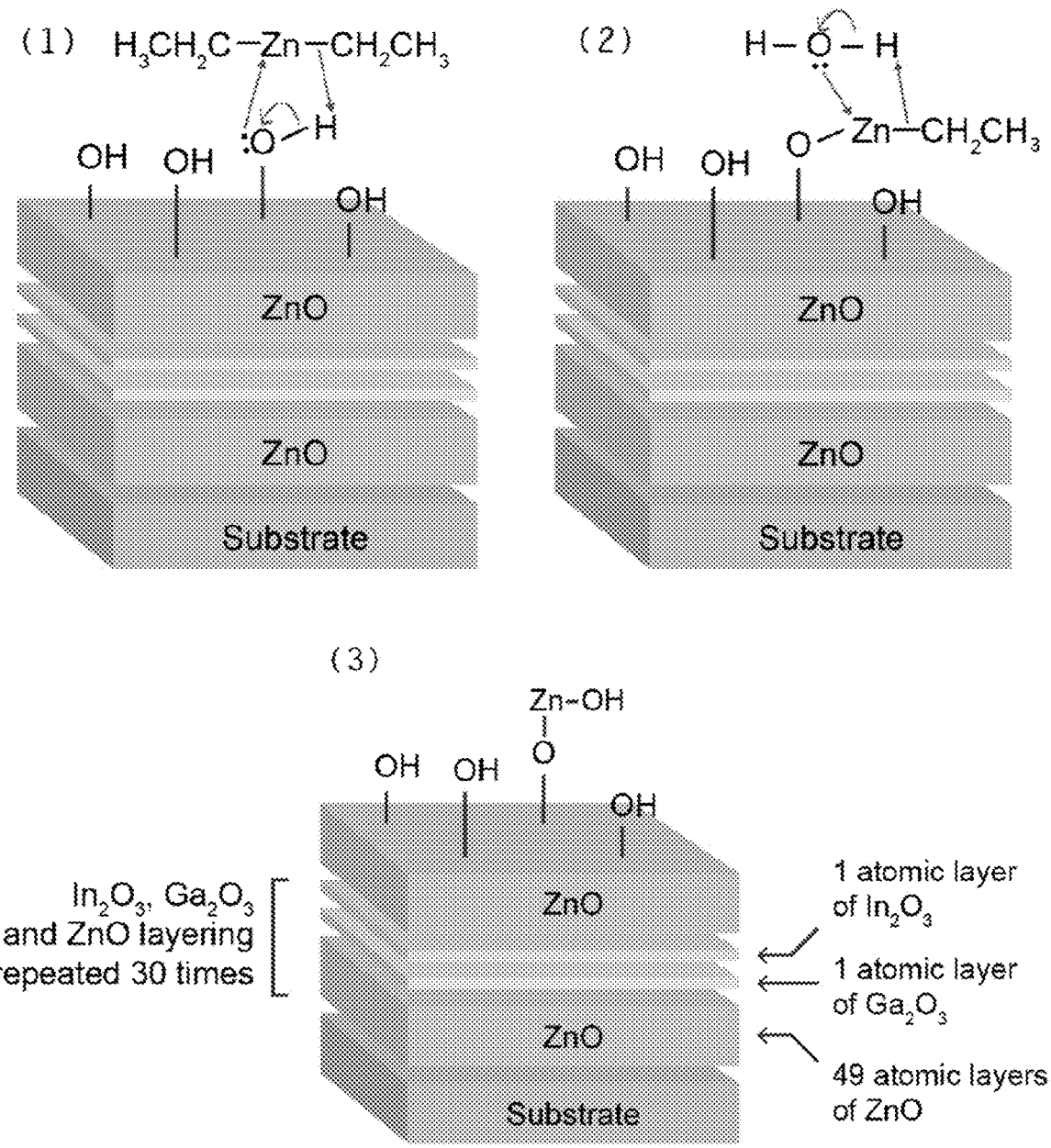

FIG. 1C depicts a non-limiting example of a co-doped semiconductor material, namely IGZO, formed from the digital doping method described herein. As seen in FIG. 1C, the IGZO may be formed by depositing 49 layers of ZnO on a substrate, then depositing 1 atomic layer of $Ga_2O_3$ on the ZnO, then depositing 1 atomic layer of $In_2O_3$ on the $Ga_2O_3$, and then depositing another 49 layers of ZnO on the $In_2O_3$. Given that this layer structure has 98 total layers of ZnO, 1 layer of $In_2O_3$, and 1 layer of $Ga_2O_3$, the resulting material is doped with 1% In and 1% Ga. However, this is merely one non-limiting example. The proportions of the layers may be changed, the number of the layers may be changed, and the order of the layers may be changed. For example, the order of the Ga and In can be switched. As another example, the number of ZnO layers could be reduced by half in order to make the material doped 2% with In and 2% with Ga. Also, it is not strictly necessary that the single atomic layer of dopant material be sandwiched between oxide layers. Rather, it is possible to simply deposit a single atomic layer of dopant material onto a plurality of oxide layers to thereby form a doped oxide semiconductor material. Furthermore, the oxide is not limited to ZnO. Rather, the oxide can be any oxide semiconductor material, including, but not limited to: ZnO, CdO, $In_2O_3$, indium tin oxide (ITO), $SnO_2$, or aluminum zinc oxide (AZO).

The compositions described herein may be formed as thin films on any substrate. Non-limiting examples of suitable substrate include glass, sapphire, fused silica, $Si/SiO_2$, quartz, strontium titanium oxide (STO), barium-doped STO (BSTO), and polymers. The identity of the substrate is not particularly limited.

Overall, the room temperature electrical properties of the example IGZO thin films described herein can be comparable to, or better than, the industry standards ITO films. Thus, the present disclosure provides IGZO as a comparable or better TCO material than most standard TCO materials. Furthermore, indium is expensive and a trace element, and so there is considerable demand for an alternative such as ZnO, which is relatively cheap. Advantageously, the IGZO uses a very tiny amount of In compared to the standard ITO, which is mainly In. The IGZO may be used as a TCO material in any optoelectronic device, such as, but not limited to, flat panel displays, photovoltaic devices (such as dye-sensitized solar cells), and LEDs. As further non-limiting examples, the IGZO may be used as electrodes on light emitting diodes and photovoltaic devices, as laser diodes for data storage or telecommunication, or in optoelectronic devices such as optical fibers, incandescent lamps, and photo resistors. Recent innovations in optoelectronics such as microscopic light bulbs, inexpensive 3D imaging, laser-powered 3D display technology, and laser li-fi may bring about a quantum shift in dynamic applicability areas of optoelectronic equipment in which materials such as IGZO are highly desired. As some further non-limiting examples, IGZO may be particularly useful in mobile phone and tablet displays. An IGZO display offers power savings of 80% to 90% while displaying images compared to a LCD display panel. IGZO is less influenced by noise and has better mobility than Si.

Examples

By using a doping approach referred to herein as "digital doping", TCO nanofilms with comparable or higher conductivity and light transparency than industry standard indium tin oxide (ITO) were fabricated. ZnO thin films were digitally doped by means of atomic layer deposition on various commercial and homegrown substrates, and ZnO co-doped with In and Ga (IGZO) was developed as a superior TCO. The thin films exhibit structural stability, high conductivity at room temperature, high visible range transparency, and a band gap near 3.42 eV. Optical and electrical characteristics were used to calculate a figure of merit $\Phi=1.29\times10^{-2}\Omega^{-1}$ for IGZO, rivalling the industry standard ITO. Temperature dependent electrical transport measurements of IGZO films revealed fully degenerate semiconductor behavior. The compositions tested gave results indicating that IGZO is better than the industry standard ITO.

IGZO has gained significant attention because of its low-temperature processing and stable high performance characteristics in thin-film transistor (TFT) applications. Furthermore, IGZO may be used as a TCO. While indium tin oxide (ITO) currently dominates the TCO market, IGZO is a promising non-toxic replacement as it is a wide band gap semiconductor (3.4 eV) that can achieve high mobility (>10 cm$^2$/V×s) and n-type carrier density ($\approx 10^{19}$ cm$^{-3}$) with little compromise to transparency. Zinc oxide (ZnO) is a widely used material that is regularly doped with low concentrations of metal ions for various applications and the doping efficiency depends on the electronegativity and ionic radius of the dopant. The ionic radii of In$^{3+}$ and Ga$^{3+}$ atoms are 80 and 62 μm, respectively, making them suitable dopants in ZnO, as the ionic radius of Zn$^{2+}$ is 74 μm. These atoms have a higher valency than Zn$^{2+}$ and act as shallow donors in ZnO, increasing the room temperature carrier concentration. In addition, In$^{3+}$ ions have a significantly larger ionic radius that introduces stress into the ZnO lattice, which has been found to affect grain size with increasing doping concentration. Furthermore, varying processing temperatures can also affect the properties of ZnO thin films.

IGZO has been previously synthesized using co-sputtering and pulsed laser deposition (PLD) techniques to deposit an amorphous layer from various premade targets based on mixtures of indium oxide (In$_2$O$_3$), gallium oxide (Ga$_2$O$_3$), and ZnO. However, these techniques require advanced target preparation which can lack doping precision at low concentrations, and resultant films can be nonuniform and exhibit inadequate performance without post-deposition treatment processes. Fortunately, ALD enables large-scale uniformity with atomic layering precision through self-limiting chemical reactions, and has successfully been used to deposit high quality In$_2$O$_3$, Ga$_2$O$_3$, and ZnO at relatively low temperatures. In the present examples, this atomic precision is used to digitally dope ZnO thin films with In$^{3+}$ and Ga$^{3+}$, in a manner different from conventional doping.

IGZO was deposited onto a variety of commercial and homegrown oxide substrates, simultaneously, in an ALD process. Fused silica, c-plane sapphire, and silicon buffered with a 1-μm silicon oxide layer (Si/SiO$_2$) were commercially prepared, while strontium titanium oxide (STO) and barium-doped STO (BSTO) were grown on commercial substrates as buffer layers. ALD uses the time-controlled introduction of metal-ion precursors and oxygen with in-sequence purging steps to deposit thin-film oxides, 1 atomic layer at a time.

Diethyl zinc (DEZ), trimethyl gallium (TMG), and cyclopentadienyl indium (InCp) precursors were pulsed for 0.06 s in order to react with the surface layer, followed by an oxidant pulse, forming an atomic metal oxide layer. H$_2$O was an oxidant for the ZnO and Ga$_2$O$_3$ layers, while plasma-assisted oxygen was used to oxidize the In$_2$O$_3$. There was a 30 s N$_2$ purge between each precursor and oxidant pulse to clear the deposition chamber of the alkane reaction by-products. One ALD cycle was composed of: metalorganic pulse, N$_2$ purge, oxidant pulse, N$_2$ purge. The chamber was held at 250° C. with a base vacuum pressure of 0.22 torr. The layering process is shown schematically in FIG. 1C to show that IGZO films were grown by depositing 49 layers of ZnO, followed by 1 layer of Ga$_2$O$_3$ and 1 layer of In$_2$O$_3$, and repeating that cycle 30 times for a total of 1530 layers. The ALD reaction mechanisms for DEZ (summarized in FIG. 1C), TMG, and InCp are discussed in the literature. To compare the effect of In$^{3+}$ as a dopant, gallium-doped ZnO (GZO) was grown by ALD in a similar process and characterized with the same equipment.

As a brief description of the half reactions, when DEZ is introduced into the deposition chamber, it reacts with hydroxyl groups (—OH) on the substrate surface:

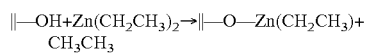

The monoethyl zinc compound may also then react with —OH on the surface, but this does not happen as often as the above-described reaction between DEZ and —OH, and is usually excluded:

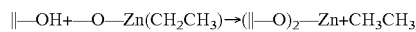

Then, H$_2$O is introduced as a reactant:

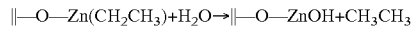

When TMG is introduced into the deposition chamber, it diffuses to the surface and reacts with hydroxyl groups (—OH), like DEZ:

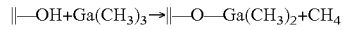

Next, H$_2$O is introduced as the oxidant precursor:

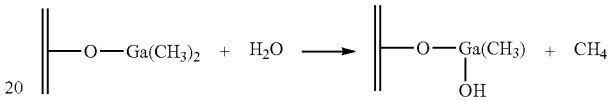

It takes at least two H$_2$O molecules to fully remove the methyl groups. It may take 5 oxidant cycles to completely remove all —CH$_3$ groups. However, only one oxidant pulse was used in these examples, so as to introduce Ga$^{3+}$ into ZnO.

The reaction mechanisms for InCp ALD reactions can be summarized as follows:

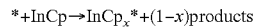

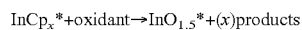

where the * represent surfaces species. In these examples, one pulse of plasma-assisted O$_2$ was used as an oxidant.

X-ray diffraction (XRD) measurements were performed to confirm a ZnO wurtzite structure and examine the effects the substrates had on the grain size and crystallinity of the IGZO films. Scanning electron microscopy (SEM) was used for surface imaging and to determine IGZO film thickness of 160±2 nm, which equates to an average thickness of 1.04 Å per layer. Given that the total number of layers was 1530, this average thickness of 1.04 Å per layer is a strong indication that one atomic layer was deposited per pulse. Atomic force microscopy (AFM) measurements constructed surface roughness images and calculated root mean square (rms) values for IGZO. The temperature-dependent Hall Effect determined the electrical properties of IGZO from 10-320 K, with a room temperature resistivity as low as 7.74×10$^{-4}$ Ω-cm. Ultraviolet-visible (UV-VIS) analysis was used to confirm the bandgap of ZnO (3.4 eV) and examine the optical transparency (>97% at 550 nm). The IGZO transparent conductors produced in these examples display a figure of merit (FOM) Φ=1.29×10$^{-2}$Ω$^{-1}$ when deposited on fused silica, demonstrating that IGZO is a versatile, high quality TCO. Annealing processes were carried out at 400° C. and showed that post-deposition processing does not enhance electronic properties, indicating a film growth that yields a low concentration of structural defects.

Figure 2:
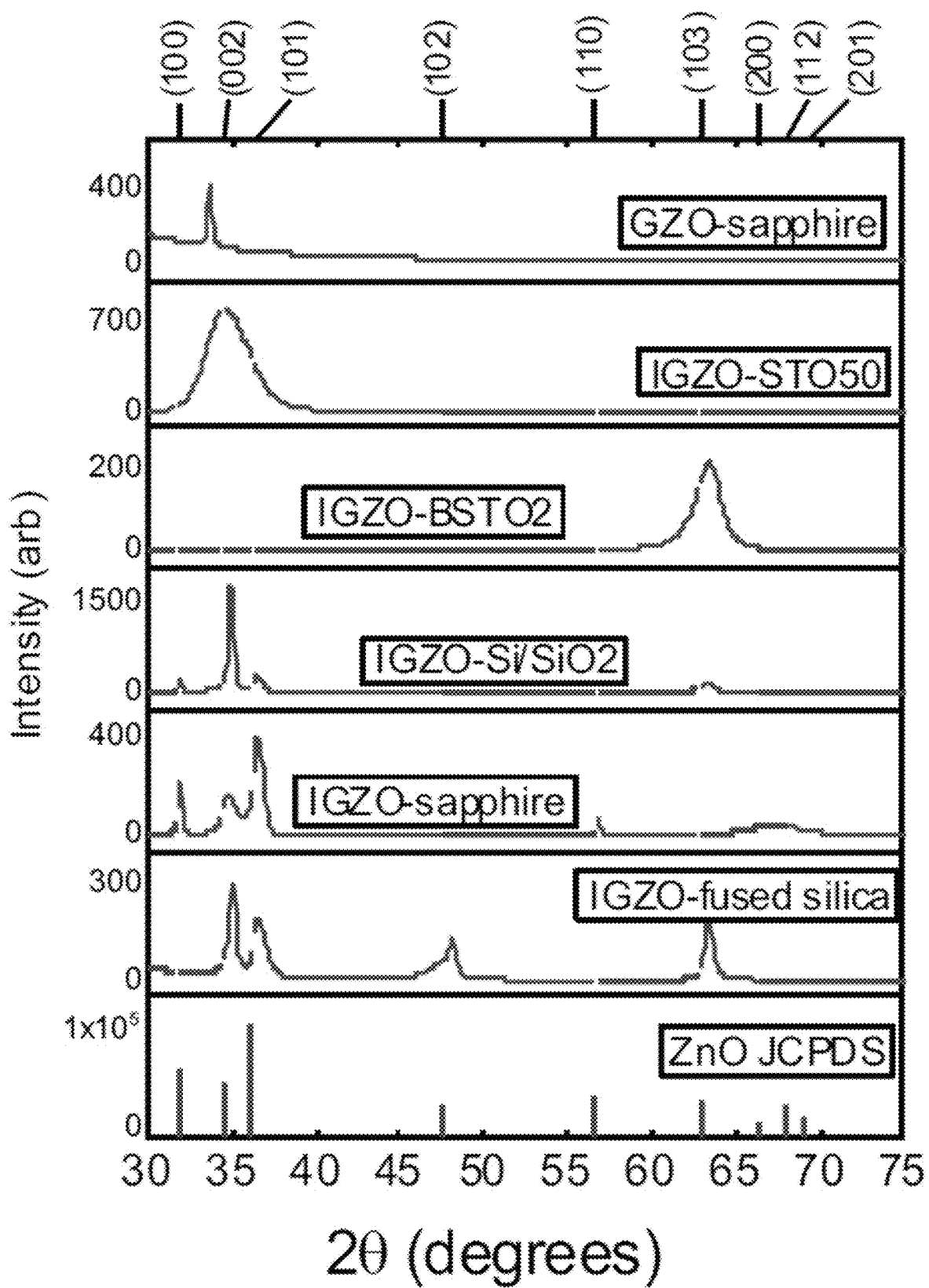
FIG. 2: XRD spectra for IGZO wurtzite structure on various commercial and homegrown substrates, exhibiting ZnO polycrystalline and amorphous nature.
Figure 3:
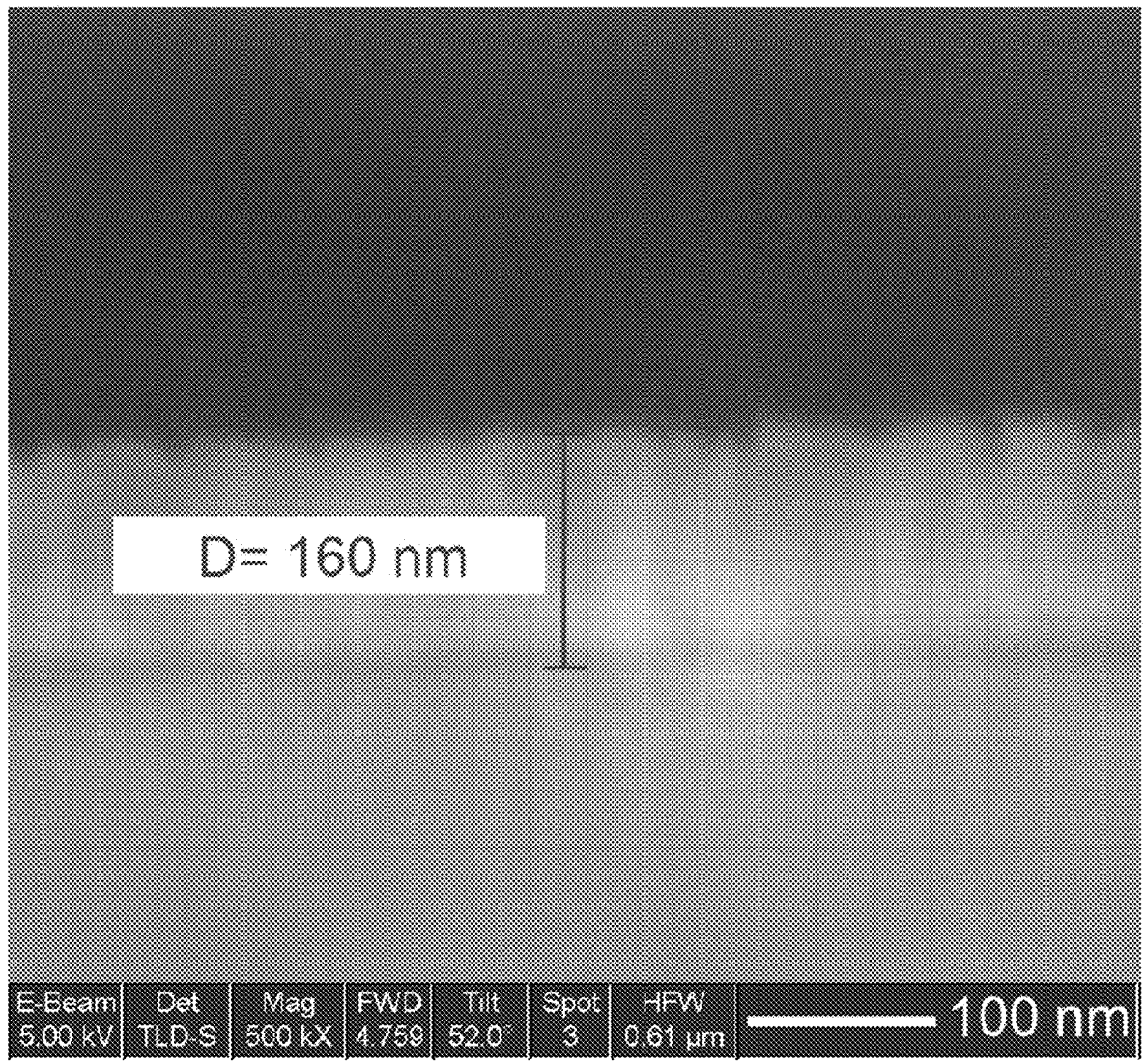
FIG. 3: Cross-sectional SEM measurements for IGZO on sapphire.
Figure 4:
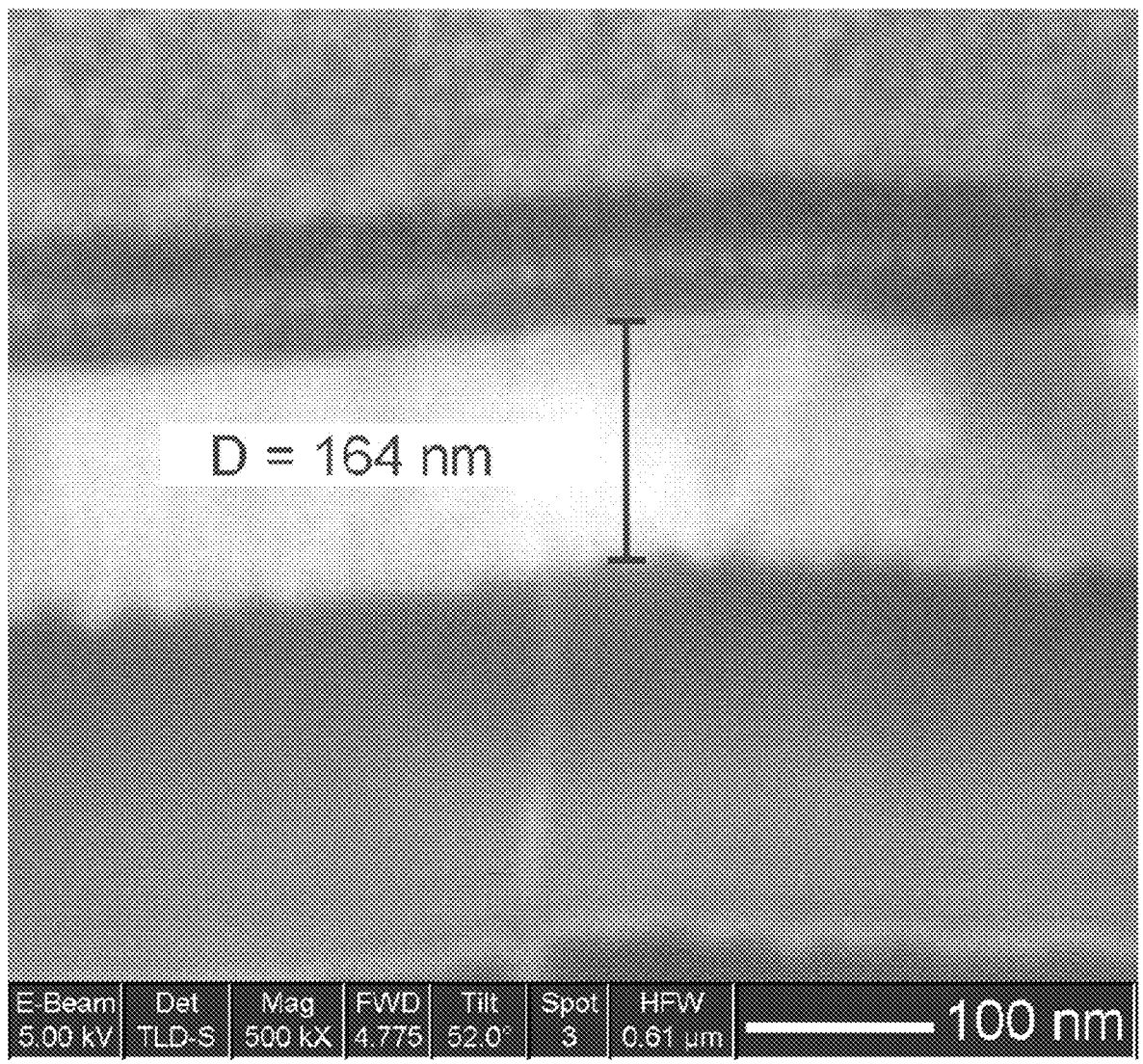
FIG. 4: Cross-sectional SEM measurements for IGZO on STO.
Figure 5:
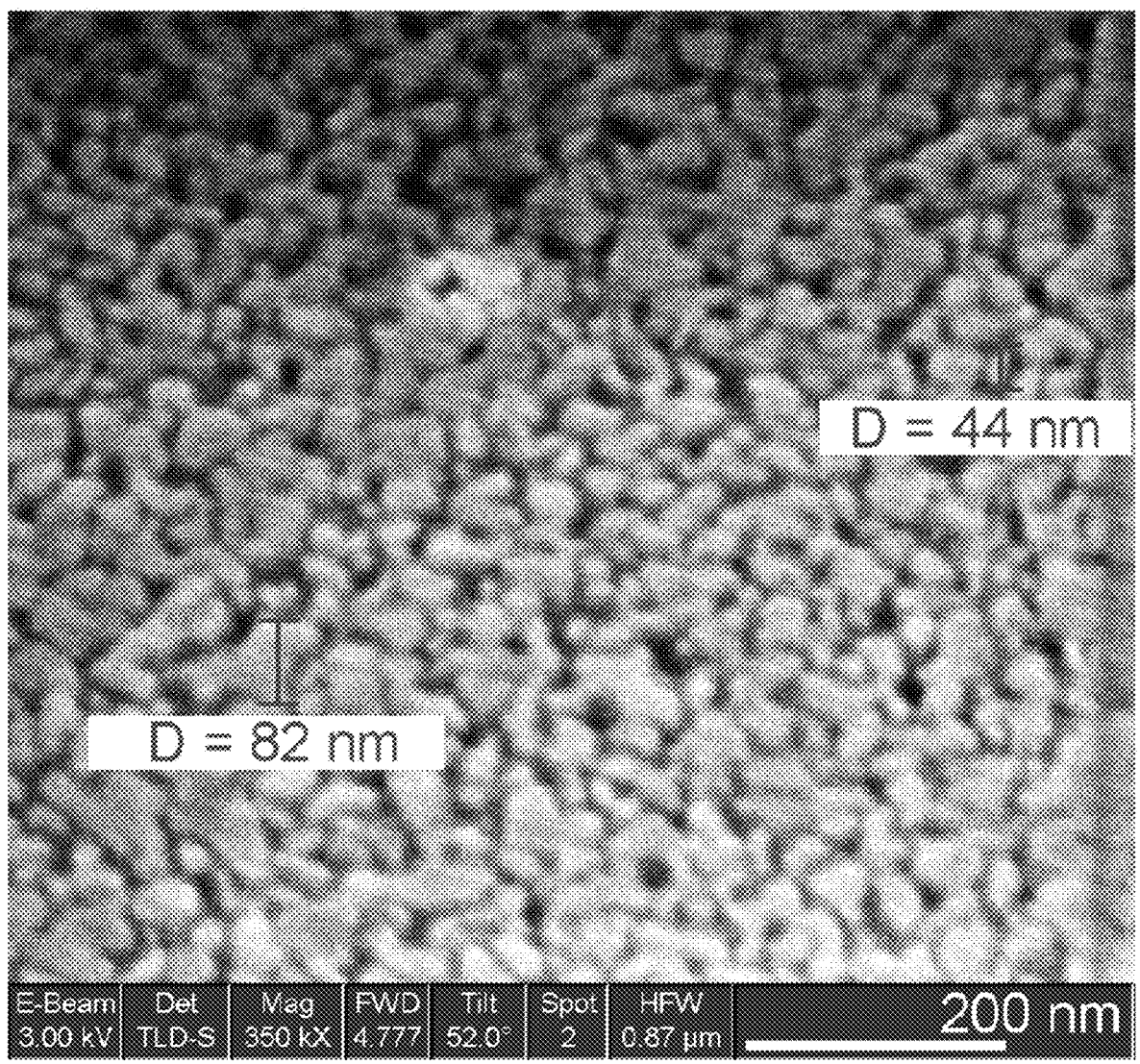
FIG. 5: High-resolution SEM surface measurements for IGZO on sapphire.
Figure 6:
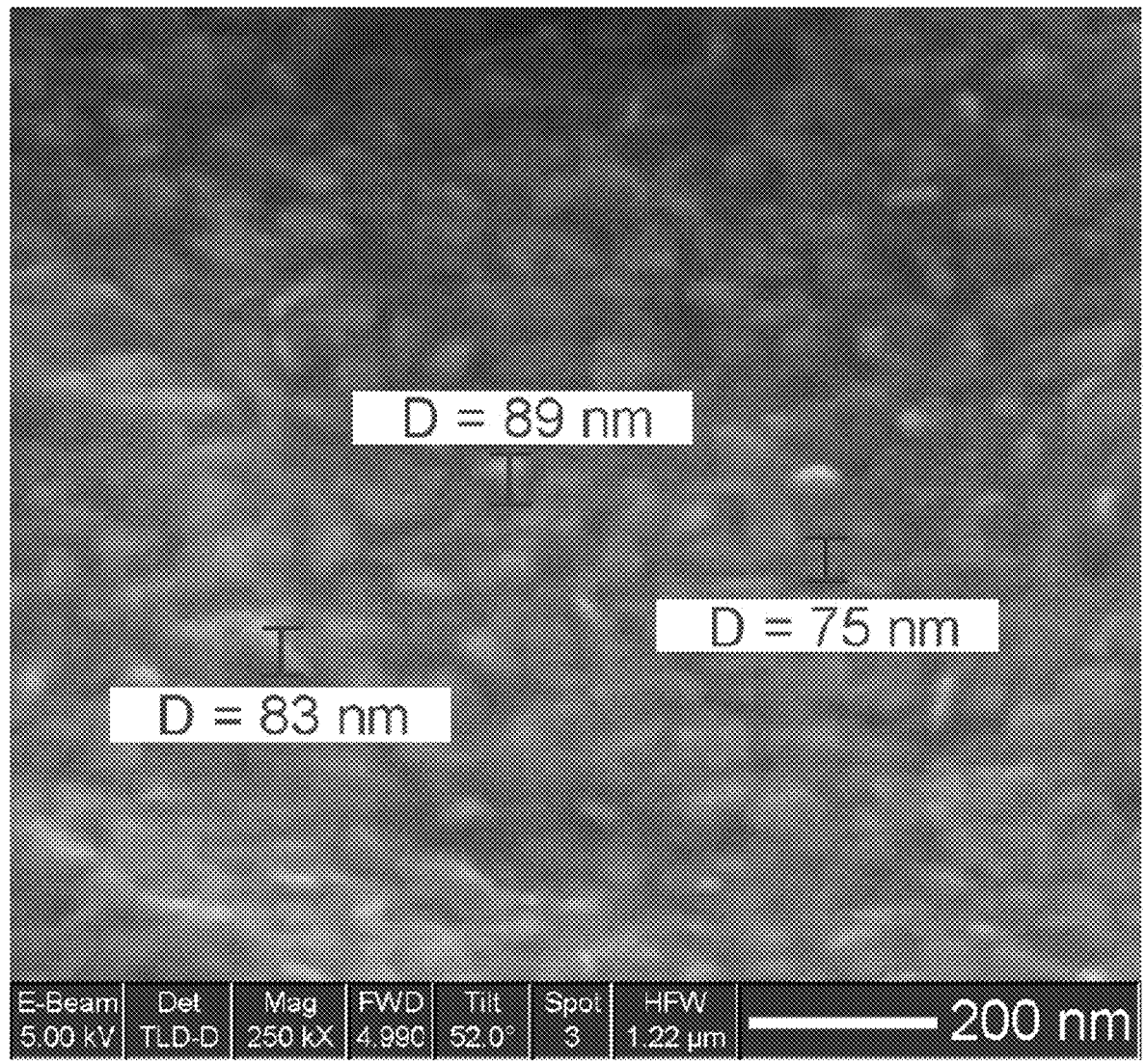
FIG. 6: High-resolution SEM surface measurements for IGZO on STO.

XRD patterns for IGZO thin films are compiled in FIG. 2. Average grain size D was calculated for each 0 peak using the Scherrer equation:

$$D = 0.9\lambda/\beta \cos\theta$$

where β is the full-width at half-maximum of the corresponding peak, θ is the Bragg angle, and λ is the wavelength of the Cu Kα x-ray source (λ=1.54 Å). Standard ZnO diffraction patterns from Joint Committee on Powder Diffraction Standards (JCPDS) are included in FIG. 2 to identify crystal orientations and analyze peak shifts. Average grain size and ZnO crystal orientations (hkl) are listed in Table 1 below. IGZO films exhibit ZnO wurtzite structure and have either polycrystalline or amorphous nature. No crystalline phases of $Ga_2O_3$ and $In_2O_3$ were observed, indicating that the $Ga^{3+}$ and $In^{3+}$ ions either substituted for the $Zn^{2+}$ in the ZnO lattice or exist at an interstitial site. While IGZO can be grown on a variety of substrate materials, these examples show that the growth orientation greatly depends on substrate surface. Here, IGZO has been successfully deposited on fused silica, sapphire, $Si/SiO_2$, STO, and BSTO. As seen in FIG. 2, the 2θ peak values corresponding to all the IGZO films is clearly shifted to the right of the JCPDS standard 2θ value. Contrarily, the 2θ peak value for GZO is shifted to the left of the JCPDS standard, indicating that $In^{3+}$ and $Ga^{3+}$ induce different kinds of stress in ZnO materials, affecting the lattice constant and, thus, the peak shift. In addition, it is clear that GZO (on sapphire) has a larger average grain size than all the IGZO films in general, and a larger (002)-associated grain size than IGZO on sapphire. The grain sizes for the (002) phase of GZO and IGZO on sapphire are 50.06 and 10.37 nm, respectively.

TABLE 1

XRD spectra for IGZO wurtzite structure on various commercial and homegrown substrates, exhibiting ZnO polycrystalline and amorphous nature

| Sample - substrate | ZnO (hkl) orientations | Average Crystallite Size (nm) | Estimated Standard Deviation (nm) |
|---|---|---|---|
| IGZO - fused silica | (002) (101) (102) (103) | 17.03 | 4.12 |
| IGZO - sapphire | (100) (002) (101) (110) (200) | 23.82 | 5.42 |
| IGZO - Si/SiO2 | (100) (002) (101) (103) | 28.78 | 3.42 |
| IGZO - BSTO | (103) amorphous | 5.72 | 1.81 |
| IGZO - STO | (002) amorphous | 2.94 | 0.16 |

SEM images, shown in FIGS. 3-6, revealed the film thickness and surface morphology of IGZO layers (labelled by red markers) grown on sapphire and STO substrates. For film thickness measurements, a protective layer of platinum was deposited on the surface of IGZO and a focused ion beam was used to mill a trench into the surface of the sample. Cross-sectional analysis (FIGS. 3-4) was carried out at a tilt angle of 52.0° normal to the surface to measure thicknesses of 160 nm and 164 nm for IGZO on sapphire and STO, respectively. In these images, it is seen that IGZO on sapphire has a sharper interface than IGZO on STO, indicating that STO has a rougher surface. Without wishing to be bound by theory, it is believed that the difference observed may explain why IGZO has polycrystalline growth on sapphire and amorphous growth on STO. Further analysis of the cross-sectional images reveals that the surface of IGZO on sapphire is rougher than the surface of IGZO on STO due to the polycrystalline and amorphous nature of each film, respectively. Although individual grains could not be reasonably distinguished in high resolution surface images (FIGS. 5-6), it can be confirmed that IGZO on sapphire has a much greater concentration of surface voids than IGZO on STO.

Figure 7:
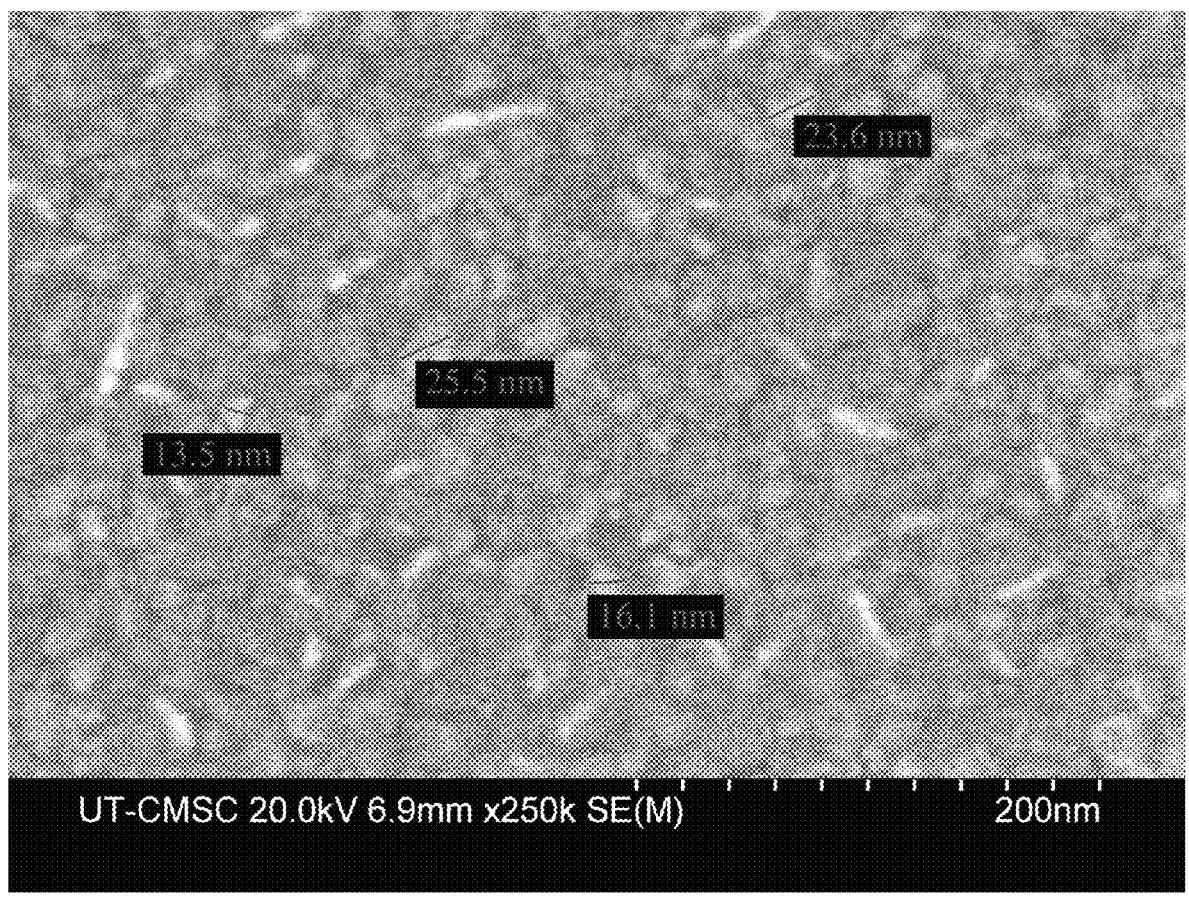
FIG. 7: SEM surface measurements for GZO on sapphire.

GZO surfaces were also imaged with SEM (FIG. 7) to compare its grain size to IGZO for both films grown on sapphire substrates. The average grain size for GZO is 19±4.3 nm and the average for IGZO is 50.8±12.8 nm, indicating that the addition of $In^{3+}$ increases that grain size.

Figure 8:
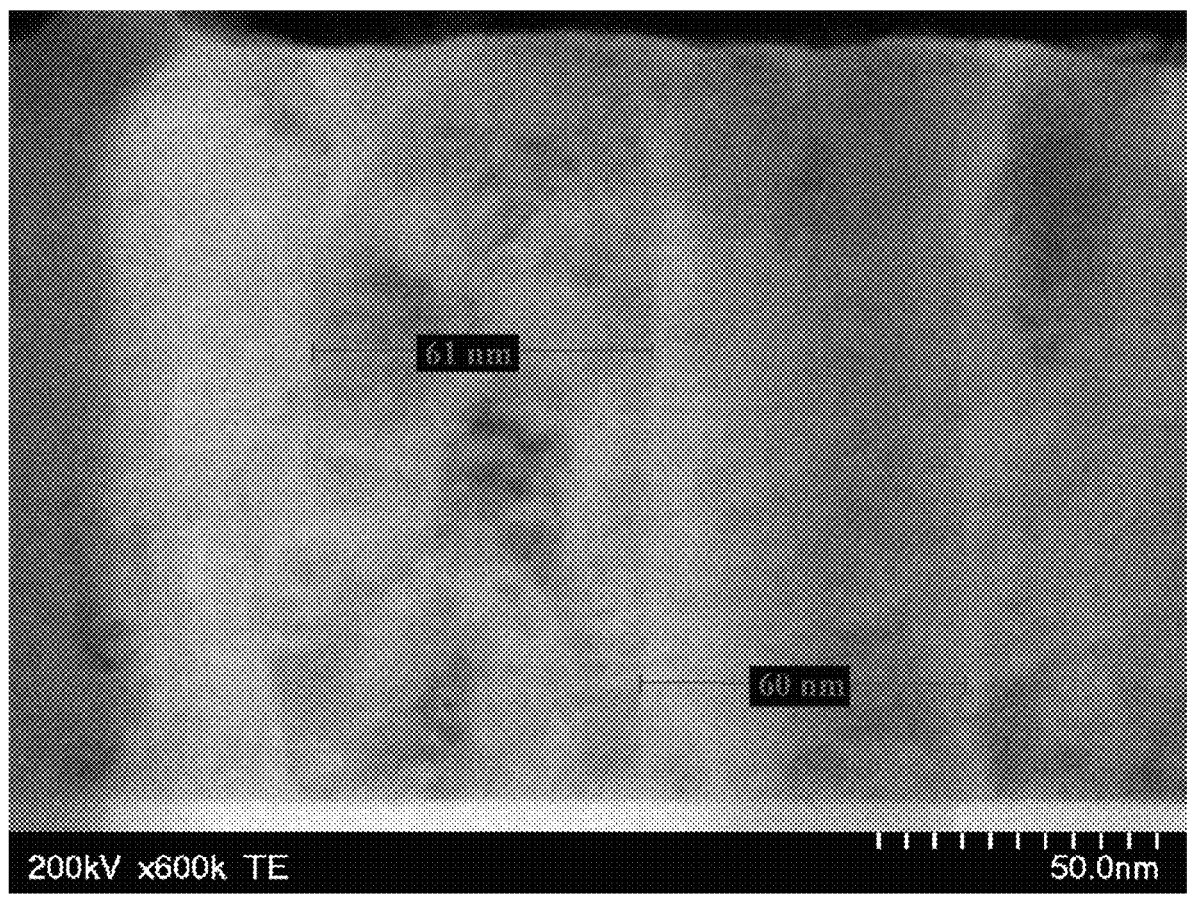
FIG. 8: Cross-sectional TEM measurements for IGZO on sapphire.

Transmission electron microscopy (TEM) was employed to obtain a more resolved cross-section on IGZO. (FIG. 8.) In FIG. 8, vertical grain growth with a width of ~60 nm is seen. This is close to the average grain size measured through SEM surface images (~50 nm). In addition, the thickness was measured to be 140 nm.

Figure 9:
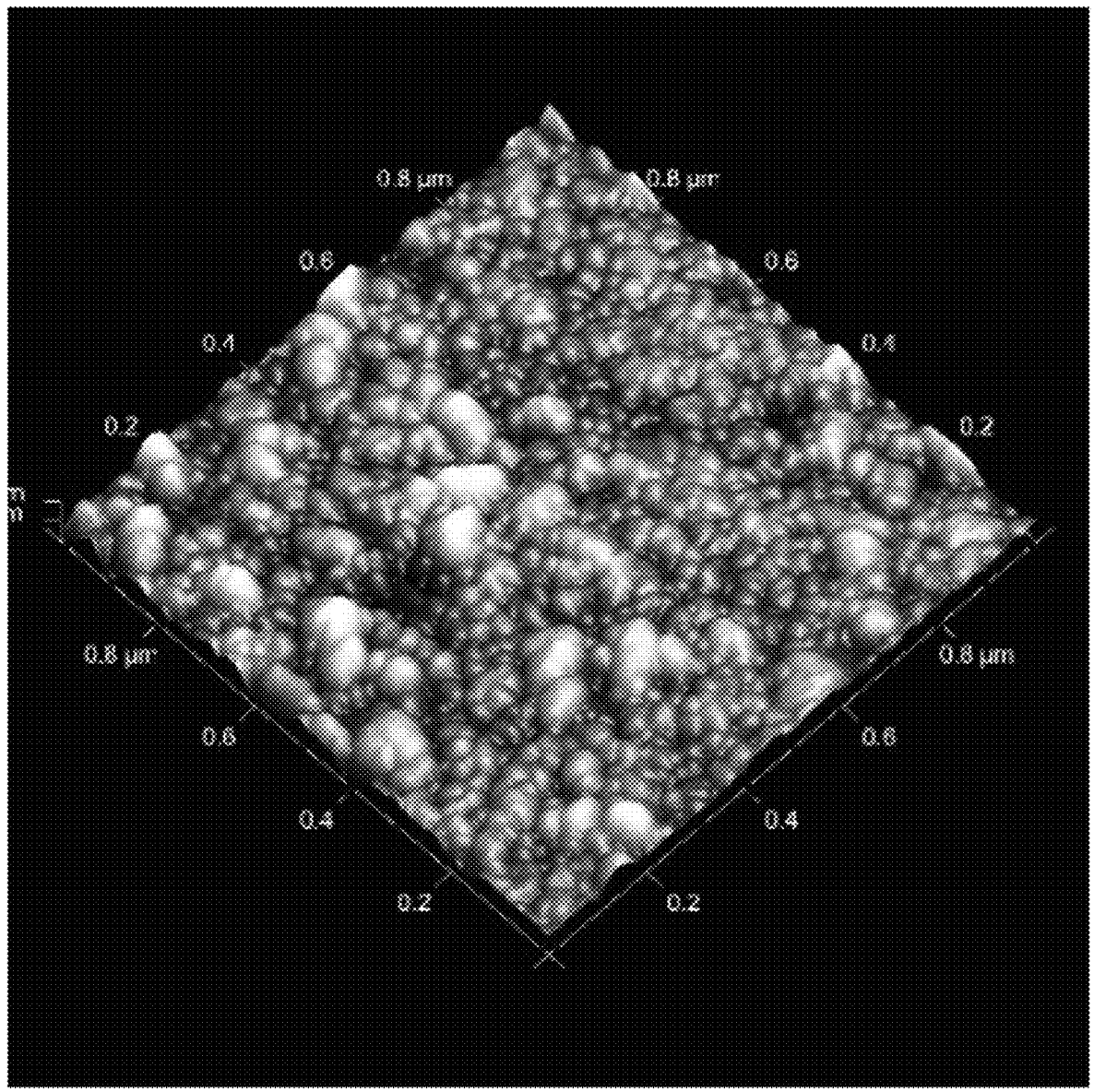
FIG. 9: AFM roughness image for IGZO on fused silica (rms roughness=0.70 nm). Measured area=1 μm×1 μm.
Figure 10:
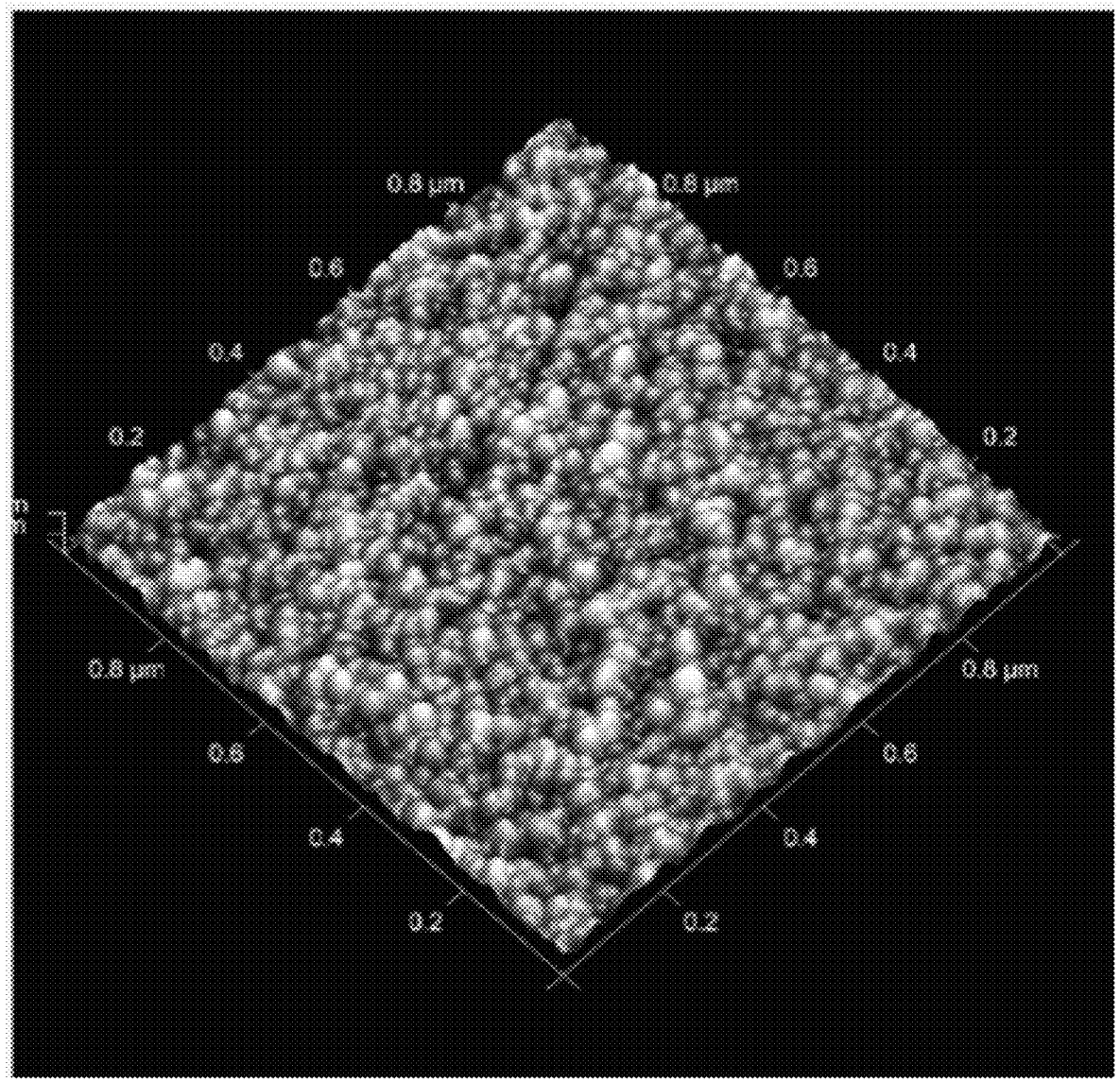
FIG. 10: AFM roughness image for IGZO on sapphire (rms roughness=2.11 nm). Measured area=1 μm×1 μm.
Figure 11:
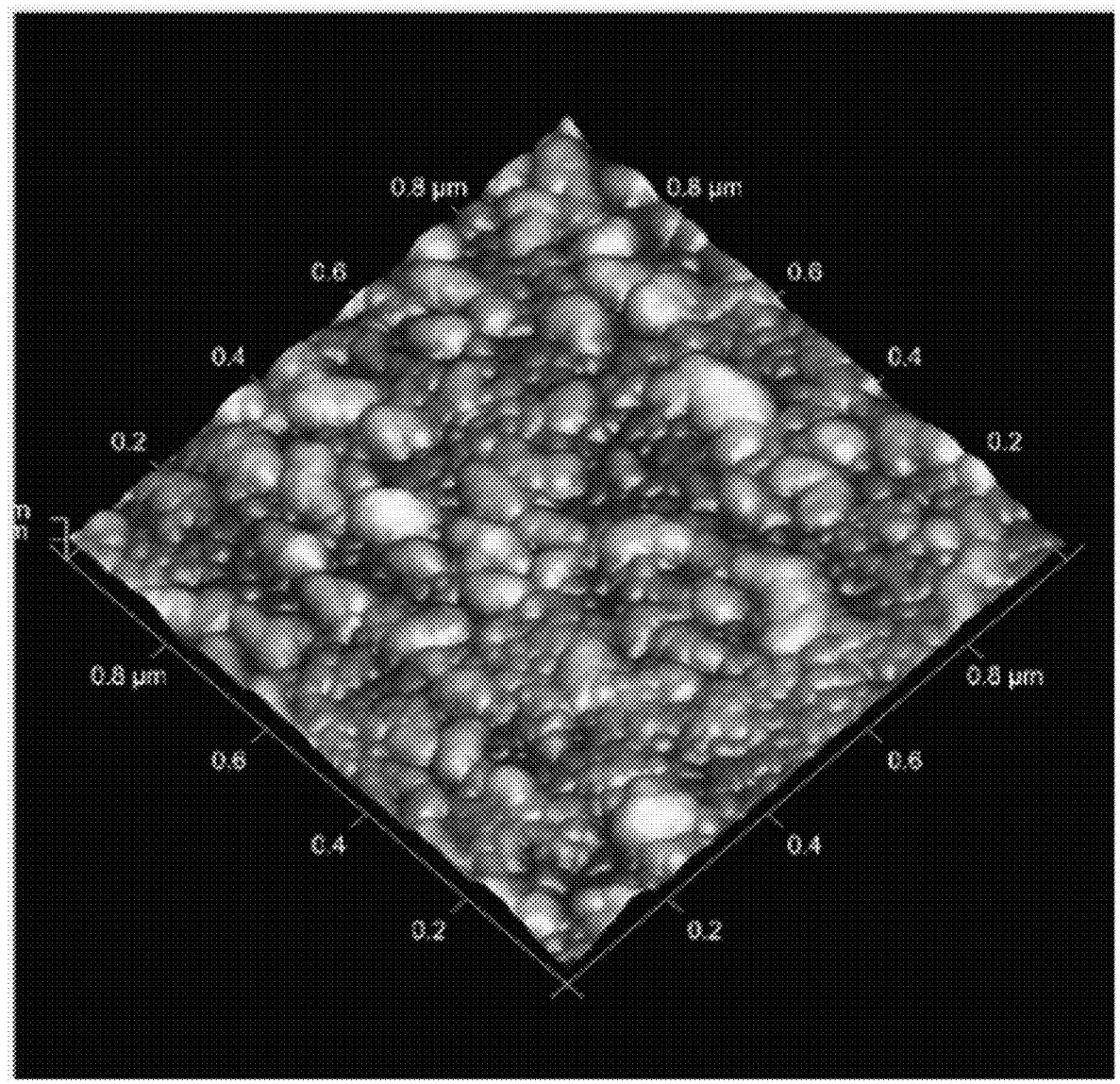
FIG. 11: AFM roughness image for IGZO on Si/SiO$_2$ (rms roughness=3.93 nm). Measured area=1 μm×1 μm.

To further investigate the surface quality of IGZO, AFM measurements were carried out to compare polycrystalline growth on fused silica, sapphire, and $Si/SiO_2$. These measurements imaged 1 m×1 m areas, presented in FIGS. 9-11, to determine rms roughnesses of 0.699 nm, 2.11 nm, and 3.93 nm for each substrate, respectively. In conjunction with XRD analysis, an increase in rms surface roughness with an increase in average grain size was observed. Understanding the surface roughness of IGZO is important for its implementation into high performance optoelectronic devices.

The electrical properties of IGZO were studied by soldering indium contacts to the surface and measuring the Hall Effect properties. The ρ, μ, and η of IGZO and GZO are listed in Table 2. Indium contacts were soldered to the surface of each IGZO sample and then connected to a four-point probe with an electromagnet to measure the resistivity, mobility, and carrier concentration, which are listed with the average grain sizes in Table 2 below. All the IGZO films had low resistivity (minimum value of $5.97 \times 10^{-4}$ Ω×cm on STO), relatively high mobility (maximum value of 24.7 $cm^2/V \times s$ on sapphire), and high n-type carrier concentration (maximum value of $6.20 \times 10^{20}$ $cm^{-3}$ on STO). In general, all IGZO films possess a lower p and higher p than the GZO film, which is due to the increase in grain size from the addition of $In^{3+}$. Another explanation for a higher p is the polycrystalline quality of the films. In doping made the films more crystalline, which also improves p, as GZO is amorphous and would have greater carrier scattering. It is also apparent that all films have relatively high η, indicative of the In and $Ga^{3+}$ donors. The high conductivity is achieved in IGZO with a thickness of only 160 nm.

TABLE 2

Summary of XRD and Hall Effect measurements for structural and electrical analysis of IGZO on each substrate.

| Sample - substrate | ZnO (hkl) orientations | Resistivity (Ω · cm) | Mobility ($cm^2/V \cdot s$) | Carrier Conc. ($cm^{-3}$) |
|---|---|---|---|---|
| IGZO - fused silica | (002) (101) (102) (103) | $9.74 \times 10^{-4}$ | 17.6 | $3.64 \times 10^{20}$ |
| IGZO - sapphire | (100) (002) (101) (110) (200) | $8.38 \times 10^{-4}$ | 22.1 | $3.36 \times 10^{20}$ |
| IGZO - $Si/SiO_2$ | (100) (002) (101) (103) | $9.59 \times 10^{-4}$ | 15.3 | $4.25 \times 10^{20}$ |
| IGZO - BSTO | (103) | $1.10 \times 10^{-3}$ | 24.7 | $2.30 \times 10^{20}$ |
| IGZO - STO | (200) | $5.97 \times 10^{-4}$ | 16.9 | $6.20 \times 10^{20}$ |
| GZO - sapphire | (002) | $1.28 \times 10^{-3}$ | 9.83 | $4.96 \times 10^{20}$ |

Figure 12:
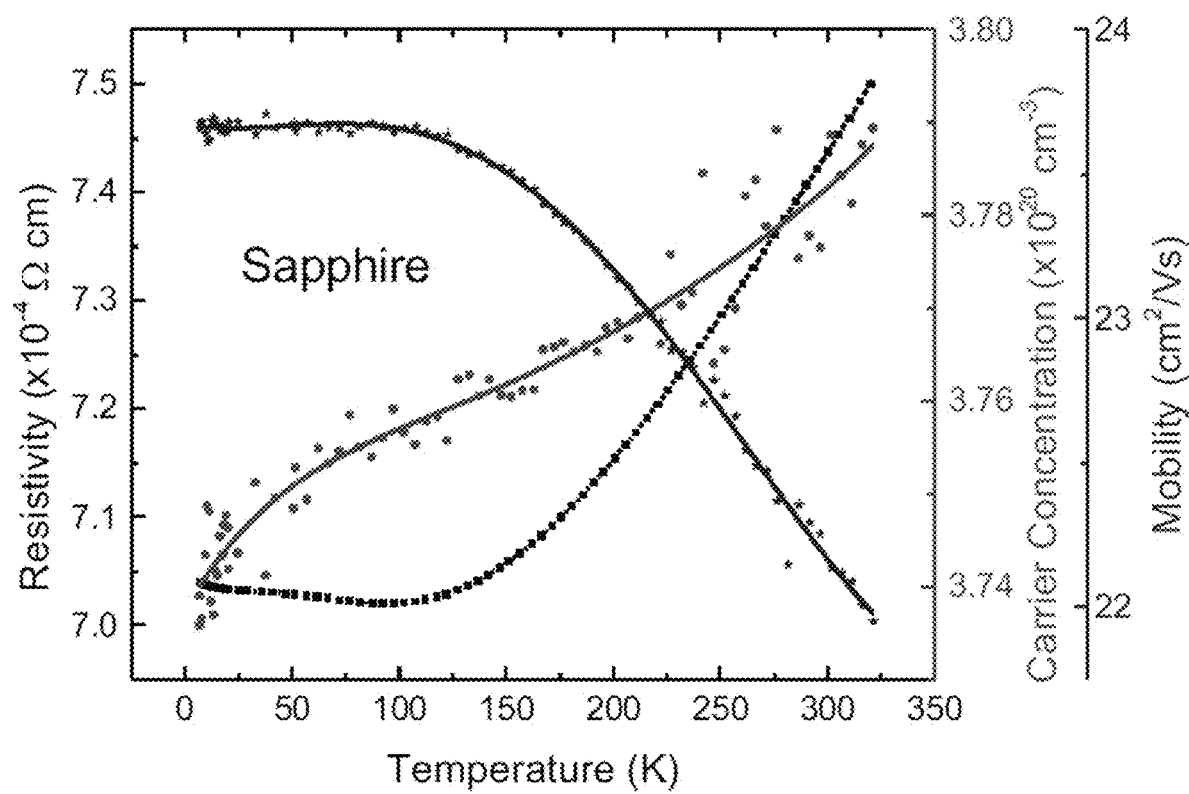
FIG. 12: The temperature dependent Hall effect for IGZO on sapphire from 10-320 K. The plots include resistivity, mobility, and carrier concentration fitted by polynomial functions.

The film of IGZO deposited on sapphire was selected for further electrical analysis by temperature-dependent Hall Effect from 10-320 K, summarized in FIG. 12. IGZO deposited on sapphire exhibits near degenerate conductivity, as IGZO has metallic behavior. This is the case because η is $>3.7 \times 10^{20}$ and only slightly increases as the temperature increases to 300 K. Still, signs of a freeze out region below 50 K can be seen. The fact that η is nearly constant creates an inverse relationship between ρ and μ. At temperatures below 100 K, the mobility p is constant. At these temperatures, phonons are not significantly vibrating, and the μ is only limited by impurity ion scattering. There is, however, no effect of scattering due to ion impurities (i.e. no change in μ). This is the case for significantly high carrier concentrations, where the average velocity of the carrier is too high for the impurity ions to have an effect. Above 100 K, the mobility p decreases as phonons begin scattering carriers, just as seen in metals.

More IGZO films were subject to post-deposition annealing to tune electrical properties. These films were annealed to 400° C. in vacuum, hydrogen, oxygen, or argon atmospheres for 1 hr. These results, shown in Table 3 below, may be due to a low defect concentration in high quality IGZO films. Nonetheless, the results indicate that high FOM IGZO TCOs do not need to undergo any post-deposition annealing to improve conductivity. The overall film resistivity slightly increased after each annealing process, with the μ and η remaining relatively stable, as summarized in Table 3. As-grown IGZO films (deposited at 250° C.) exhibit the lowest resistivity, which indicates that there is a low defect concentration in IGZO films. Overall, IGZO is a highly conductive material grown over a large area that does not need to undergo these post-processing treatments to improve its electrical properties.

used. Here, Hacke's method was used to calculate θ for IGZO on fused silica. With a T>97.6% at 550 nm and a Rs=60.9 Ω×sq$^{-1}$, Φ=1.29×10$^{-2}$Ω$^{-1}$, an 8.3% increase over that previously reported was observed, which is much higher than other reports on ZnO thin films and nearing the high FOM for ITO.

Considering these results, IGZO thin films can be fabricated to replace ITO for TCO applications. ALD was used to digitally dope ZnO thin films with indium and gallium, achieving high film conductivity and transparency at minimal thickness. Structural characteristics of IGZO, such as particle size, crystallinity, and roughness, depend greatly on the substrate material, varying the electrical properties of the film. The addition of In$^{3+}$ was found to decrease the average grain size but increase the overall conductivity, and improved the TCO FOM. Post-deposition atmospheric annealing processes do not improve, and may even hinder, electrical performance, as the film conduction depends greatly on the deposition conditions. IGZO TCOs fabricated by ALD at 250° C. do not need to undergo any post-deposition annealing to improve conductivity.

Certain embodiments of the compositions, thin films, devices, and methods disclosed herein are defined in the above examples. It should be understood that these

TABLE 3

Electrical characteristics (resistivity, mobility, and carrier concentration) measured by Hall Effect for IGZO on commercial substrates before and after annealing at 400° C. in different atmospheres.

|  | as-grown | vacuum | H$_2$ | O$_2$ | Ar |
|---|---|---|---|---|---|
| Resistivity (Ω · cm) | | | | | |
| sapphire | 7.74 × 10$^{-4}$ | 1.10 × 10$^{-3}$ | 8.61 × 10$^{-4}$ | 9.74 × 10$^{-4}$ | 9.17 × 10$^{-4}$ |
| fused silica | 9.74 × 10$^{-4}$ | 1.68 × 10$^{-3}$ | 1.10 × 10$^{-3}$ | 1.31 × 10$^{-3}$ | 1.51 × 10$^{-3}$ |
| Si/SiO$_2$ | 9.59 × 10$^{-4}$ | 1.39 × 10$^{-3}$ | 1.02 × 10$^{-3}$ | 1.32 × 10$^{-3}$ | 1.18 × 10$^{-3}$ |
| Mobility (cm$^2$/V · s) | | | | | |
| sapphire | 23.4 | 20.1 | 20.7 | 20.3 | 19.8 |
| fused silica | 17.6 | 13.9 | 16.6 | 16.0 | 14.6 |
| Si/SiO$_2$ | 15.3 | 15.8 | 16.7 | 15.6 | 16.0 |
| Carrier Concentration (cm$^{-3}$) | | | | | |
| sapphire | 3.23 × 10$^{20}$ | 2.51 × 10$^{20}$ | 3.10 × 10$^{20}$ | 2.80 × 10$^{20}$ | 3.05 × 10$^{20}$ |
| fused silica | 3.41 × 10$^{20}$ | 2.37 × 10$^{20}$ | 3.01 × 10$^{20}$ | 2.63 × 10$^{20}$ | 2.51 × 10$^{20}$ |
| Si/SiO$_2$ | 3.98 × 10$^{20}$ | 2.51 × 10$^{20}$ | 3.27 × 10$^{20}$ | 2.70 × 10$^{20}$ | 2.93 × 10$^{20}$ |

Figure 13:
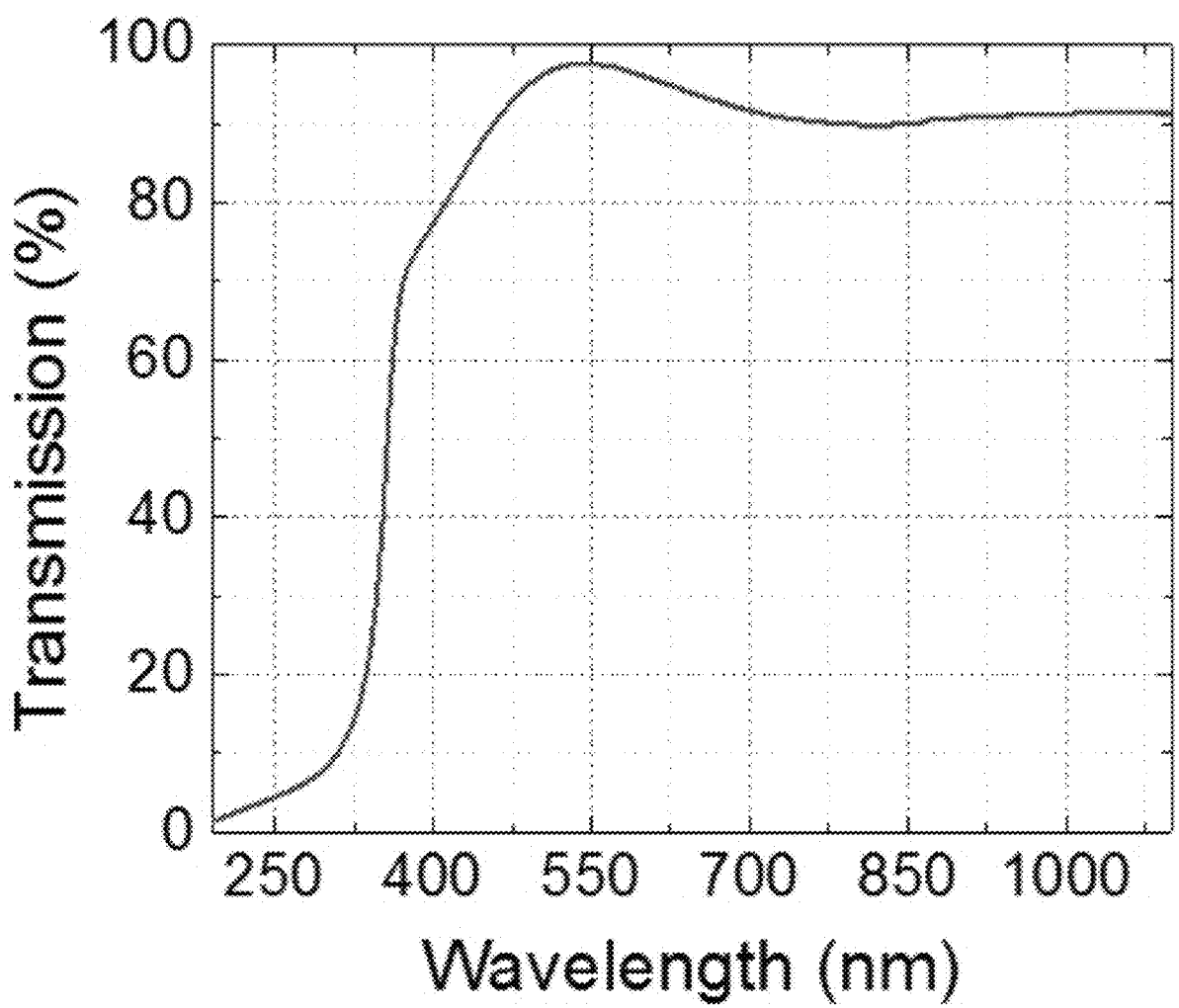
FIG. 13: UV-VIS spectroscopy measurements of IGZO on fused silica.
Figure 14:
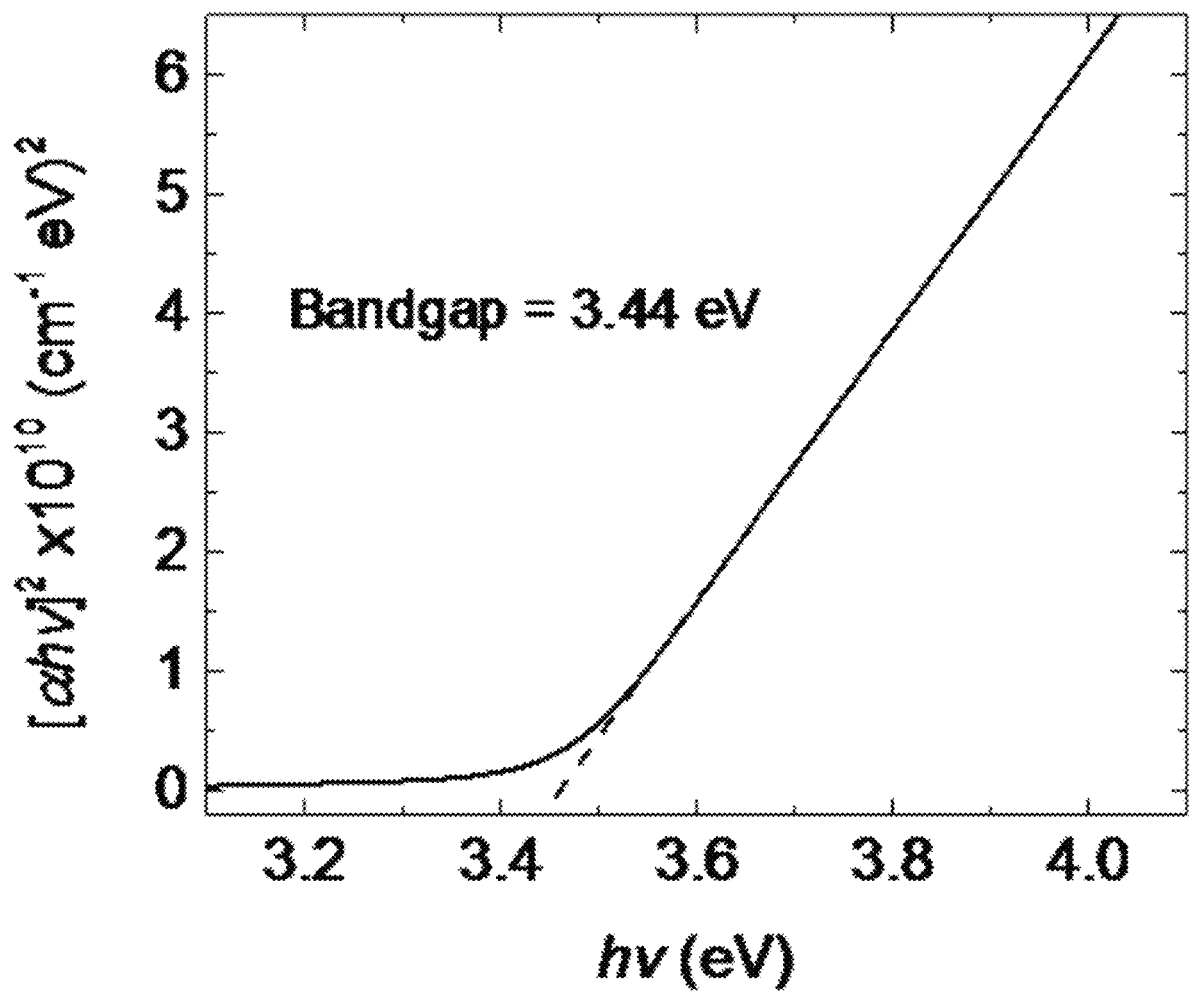
FIG. 14: Tauc plot for direct-band gap transitions with curve extrapolated to (ahv)2=0 to determine band gap of IGZO on fused silica to be 3.42 eV.

Overall, the room temperature electrical properties of the IGZO thin films presented in these examples are approaching the standards for the industry standard ITO films. UV-Vis spectroscopy analysis was used to measure the transmittance (FIG. 13) and bandgap of IGZO. The bandgap was about 3.42 eV, as calculated from a Tauc plot for direct-bandgap transitions (FIG. 14), which extrapolates a linear fit for a region of the (ahv)2 curve. The calculated $E_g$ is higher than expected for ZnO (~3.3 eV). This bandgap widening contradicts the effect that would be expected from degenerate doping. Typically, semiconductors undergo bandgap narrowing due overlapping donor energy states. But, with a significantly high η, $E_g$ increases, as the Fermi energy shifts above the conduction band minimum, resulting in a Burstein-Moss shift.

FOM values are defined by Φ=T$_{10}$/Rs, where T is the optical transmittance, Rs is the sheet resistance, according to Haacke's method. A highly transparent (90.2%) and conductive (ρ=7.2×10$^{-4}$ Ω·cm) ITO achieving a FOM Φ=1.191×10$^{-2}$Ω$^{-1}$ has previously been fabricated using a solution processing. In that case, Haacke's method was also examples, while indicating particular embodiments of the invention, are given by way of illustration only. From the above discussion and these examples, one skilled in the art can ascertain the essential characteristics of this disclosure, and without departing from the spirit and scope thereof, can make various changes and modifications to adapt the compositions and methods described herein to various usages and conditions. Various changes may be made and equivalents may be substituted for elements thereof without departing from the essential scope of the disclosure. In addition, many modifications may be made to adapt a particular situation or material to the teachings of the disclosure without departing from the essential scope thereof.

What is claimed is:

1. A method for doping an oxide semiconductor material, wherein the method comprises:
   (i) depositing a first single atomic layer of a first oxide semiconductor on a substrate;
   (ii) depositing at least a second single atomic layer of the first oxide semiconductor directly on the first single atomic layer to form a plurality of atomic layers of the first oxide semiconductor on the substrate; and (iii) depositing one atomic layer of a first dopant material on the plurality of atomic layers of the first oxide semiconductor using $H_2O$ as an oxidant to obtain a doped oxide semiconductor material, wherein the first dopant material comprises gallium or indium;

(iv) depositing one atomic layer of a second dopant material directly on the one atomic layer of the first dopant material; and (v) repeating steps (i)-(iv) so as to obtain a doped oxide semiconductor material, wherein the doped oxide semiconductor material is a film having the first dopant material present in an amount of about 1 at % and the second dopant material present in an amount of about 1 at %.

2. The method of claim 1, wherein each of the layers is deposited by atomic layer deposition (ALD).

3. The method of claim 2, wherein the ALD comprises reacting precursors with a surface to deposit the layers, the precursors comprising diethyl zinc (DEZ), trimethyl gallium (TMG), and/or cyclopentadienyl indium (InCp).

4. The method of claim 3, wherein the DEZ is used as a precursor to deposit ZnO, the TMG is used as a precursor to deposit $Ga_2O_3$, and the InCp is used as a precursor to deposit $In_2O_3$.

5. The method of claim 4, wherein the method comprises an oxidant pulse following each pulse of precursor.

6. The method of claim 5, comprising an $N_2$ purge between each precursor and oxidant pulse.

7. The method of claim 2, wherein the ALD method is conducted in a vacuum chamber held at an elevated temperature of about 250° C. and a pressure of about 0.22 torr.

8. The method of claim 1, wherein the plurality is 49 atomic layers.

9. The method of claim 8, wherein the first oxide semiconductor comprises ZnO.

10. The method of claim 1, comprising depositing 49 atomic layers of ZnO and then depositing one atomic layer of $Ga_2O_3$ on the 49 atomic layers of ZnO.

11. The method of claim 1, wherein the first oxide semiconductor material comprises ZnO, CdO, $In_2O_3$, indium tin oxide (ITO), $SnO_2$, or aluminum zinc oxide (AZO).

12. The method of claim 1, wherein:
the depositing single atomic layers of the first oxide semiconductor on the substrate comprises depositing 49 atomic layers of ZnO;
the depositing one atomic layer of the first dopant material on the plurality of atomic layers of the first oxide semiconductor comprises depositing one atomic layer of $Ga_2O_3$ on the 49 atomic layers of ZnO; and
the depositing one atomic layer of the second dopant material on the one atomic layer of the first dopant material comprises depositing one atomic layer of $In_2O_3$ on the one atomic layer of $Ga_2O_3$.

13. The method of claim 1, wherein the depositing one atomic layer of the second dopant material on the one atomic layer of the first dopant material comprises using plasma-assisted oxygen as the oxidant.

14. A method for doping an oxide semiconductor material, wherein the method comprises:
depositing a first atomic layer of 49 atomic layers of a first oxide semiconductor on a substrate;
depositing each remaining atomic layer of the 49 atomic layers of the first oxide semiconductor directly on a preceding layer of the 49 atomic layers of the first oxide semiconductor;
depositing one atomic layer of a first dopant material on the 49 atomic layers of the first oxide semiconductor using $H_2O$ as an oxidant to dope the first oxide semiconductor, wherein the first dopant material comprises gallium or indium;
depositing one atomic layer of a second dopant material directly on the one atomic layer of the first dopant material; and
depositing 49 atomic layers of the first oxide semiconductor on the one atomic layer of the second dopant material to obtain a doped oxide semiconductor material;
wherein the doped oxide semiconductor material is a film having the first dopant material present in an amount of about 1 at % and having the second dopant material present in an amount of about 1 at %.

15. The method of claim 14, wherein the first oxide semiconductor material comprises ZnO, CdO, $In_2O_3$, indium tin oxide (ITO), $SnO_2$, or aluminum zinc oxide (AZO).

16. The method of claim 14, further comprising repeating the depositing steps 30 times.

17. The method of claim 14, wherein the depositing one atomic layer of the second dopant material on the one atomic layer of the first dopant material comprises using plasma-assisted oxygen as the oxidant.

* * * * *